US007462057B2

(12) United States Patent
Hsu

(10) Patent No.: US 7,462,057 B2
(45) Date of Patent: Dec. 9, 2008

(54) SOCKET

(75) Inventor: Hsiu-Yuan Hsu, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 11/904,481

(22) Filed: Sep. 26, 2007

(65) Prior Publication Data

US 2008/0076272 A1 Mar. 27, 2008

(51) Int. Cl.
*H01R 13/62* (2006.01)

(52) U.S. Cl. .......................................... 439/331; 439/73

(58) Field of Classification Search .................. 439/73, 439/331

See application file for complete search history.

(56) References Cited

U.S. PATENT DOCUMENTS 4,758,176 A * 7/1988 Abe et al. .................. 439/331
4,969,828 A * 11/1990 Bright et al. .................. 439/68
5,244,404 A * 9/1993 Kishi et al. .................. 439/331
5,447,448 A * 9/1995 Noriyuki .................. 439/331
5,609,497 A * 3/1997 Kawabe .................. 439/331
5,807,118 A * 9/1998 Tsubota .................. 439/73
6,033,235 A * 3/2000 Ikeya .................. 439/71
6,439,897 B1 * 8/2002 Ikeya .................. 439/73
7,214,077 B2 * 5/2007 Lu et al. .................. 439/157

* cited by examiner

*Primary Examiner*—Tho D Ta
(74) *Attorney, Agent, or Firm*—Wei Te Chung

(57) ABSTRACT

A socket for electrically connection an electronic package to a circuit board, comprises: a socket body (10) receiving a number of terminals; a floating board (11) located upon the socket body; a cover (12) rotatablely assembled to the socked body, the cover formed with at least a position portion; a pressure board (13) correspondingly formed with at least one clasp for latching with the position portion of the cover to retain the pressure board to the cover.

6 Claims, 4 Drawing Sheets

3
2
125
124
122
12
121
132
13
131
113
1131
112
111
11
110
1
14
10
104
1040

SOCKET

BACKGROUND OF THE INVENTION

1. Field of the Invention

The present invention relates to the art of electrical connectors, and more particularly to a socket for electrically connecting with an electronic Package to a circuit board.

2. Description of the Related Art

Electronic packages, such as integrated circuits (ICs), are miniaturized electronic devices, in which a number of active and passive circuit elements are located on or within a continuous body of material to perform the function of a complete circuit. To ensure reliability in use, the ICs require prior burning in to test their durability. The ICs are operated at high temperature for an extended period of time to accelerate invalidation of ICs with disfigurements. This helps eliminate early product failures once the ICs are sold and/or assembled onto electronic end products. A burn-in socket assembly is used to receive an IC therein, and electrically connects the IC with a burn-in board for operation of the IC at high temperature. Pertinent example of the burn-in socket assembly is disclosed in U.S. Pat. Nos. 5,609,497 and 5,100,332.

FIG. 1 discloses a test electrical connector 1' for mounting an electronic package (such as an IC, not shown) and electrically connecting the electronic package to a circuit board (such as testing board, not shown), the connector 1' comprises an insulating housing 10', a plurality of terminals (not shown) received in the insulating housing 10', a first cover 12' rotatablely assembled to an end of the insulating housing 10' and a second cover 14' rotatablely connecting with the first cover 12', a pressure board 16' linked with the first cover 12', a floating board 18' assembled on the insulating housing 10' and a number of springs 17' located between the insulating housing 10' and the floating board 18'. The pressure board 16' is received in a opening defined on the first cover 12', the first cover 12' and the pressure board 16' correspondingly have holes (not labeled), a pivot 11' drills through the holes to rotatablely connect the first cover 12' and the pressure broad 16'. A number of rings 13' block opposed ends of the pivot 11' for preventing the pivot 11' dropping during operating process. In use, electronic package is set on the floating board 18' and received in the insulating housing 10'. Actuating the first cover 12', the second cover 14' and the pressure board 16' to rotate, the pressure board 16' presses the electronic package to electrically contact with the terminals. However, the pressure board 16' and the first cover 12' of the connector 1' are linked by a pivot 11' and fastened by clips 13', that makes product assembly complicated and enhances product cost.

SUMMARY OF THE INVENTION

An object of the invention is to provide a burn-in socket assembly which has a pressure board easily assembled to a cover.

To achieve the above-mentioned object, a socket for electrically connection an electronic package to a circuit board, comprises: a socket body receiving a plurality of terminals; a cover rotatablely assembled to the socked body, the cover formed with at least a position portion; a pressure board correspondingly formed with at least one clasp for latching with the position portion of the cover to retain the pressure board to the cover.

Other features and advantages of the present invention will become more apparent to those skilled in the art upon examination of the following drawings and detailed description of preferred embodiments, in which:

DETAILED DESCRIPTION OF PREFERRED EMBODIMENT

Figure 1:
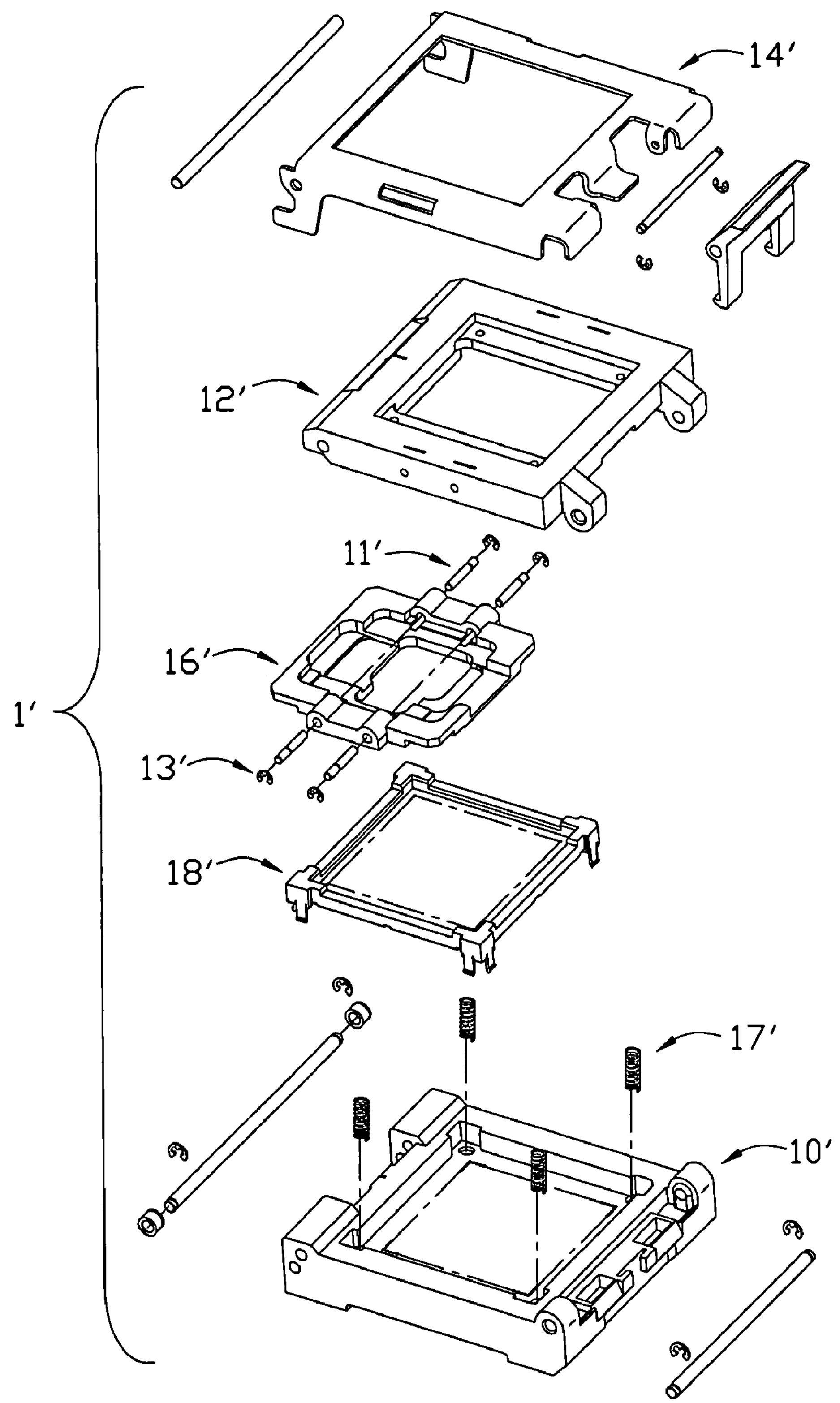
FIG. 1 is an exploded, perspective view of a conventional socket in related art.

Referring to FIGS. 2 to 5, a socket 1 for electrically connect an electronic package (such as IC 2) to a circuit board (not shown) includes a socket body 10 with a plurality of terminals (not shown) resided therein, a floating board 11 received in the socket body 10, a cover 12 rotatablely assembled to an end of the socket body 10 and a pressure board 13 connecting with the cover 12.

The socket body 10 is substantively in a rectangle shape, and defines a receiving space (not labeled). The receiving space (not labeled) has a plurality of slots 101 on four corners thereof for receiving and engaging with corresponding latching arms 110 formed on the floating board 11. The socket body 10 is formed with a plurality of terminal receiving slots (not shown) on a bottom wall 102 thereof for receiving the terminals (not shown), each having two ends of respectively extending beyond a top and a bottom surfaces of the bottom wall 102. The socket body 10 further has a plurality of spring receiving holes 103 on the bottom wall 102 thereof and a pair of engaging clumps 104 on an end thereof, which are separated with each other and each transversely defines a through hole 1040.

The floating board 11 has a supporting board 111 for bearing the IC 2, four sidewalls 112 upwardly extending from circumference of the supporting board 111 and defining a receiving room together with the supporting board 111 for receiving the IC 2. The floating board 11 has four upwardly extending L-shaped block 113 on each corner between the sidewalls 112, the block 113 and the supporting board 111 form a guiding inclined face 1131 therebetween for IC 2 inserting. A plurality of springs 14 are received in the spring receiving holes 103 of the socket body 10, when the floating board 11 is assembled to the socket body 10 by the latching arms 110 inserting into and latching with corresponding slots 101 of the socket board 10, thereby, the floating board 11 and the socket body 10 are connected together, and the springs 14 abut against a bottom face of floating board 11. So the floating board 11 is able to move downwardly by an outside force, and move back effected by the springs 14 when the outside force is released. The supporting board 111 of the floating board 11 has a plurality of terminal passageways (not shown) disposed correspondingly to the terminal receiving slots (not shown) on the bottom wall 102 of the socket body 10. When the floating board 11 moves downwardly, the end of each terminal resided in the socket body 10 protrudes into corresponding terminal passageway (not shown) of floating board 11, the end of each terminal can electrically contact with electric element of the IC 2, and the other end are electrically contacting with the circuit board, so the IC 2 is electrically connecting with the circuit board.

Figure 2:
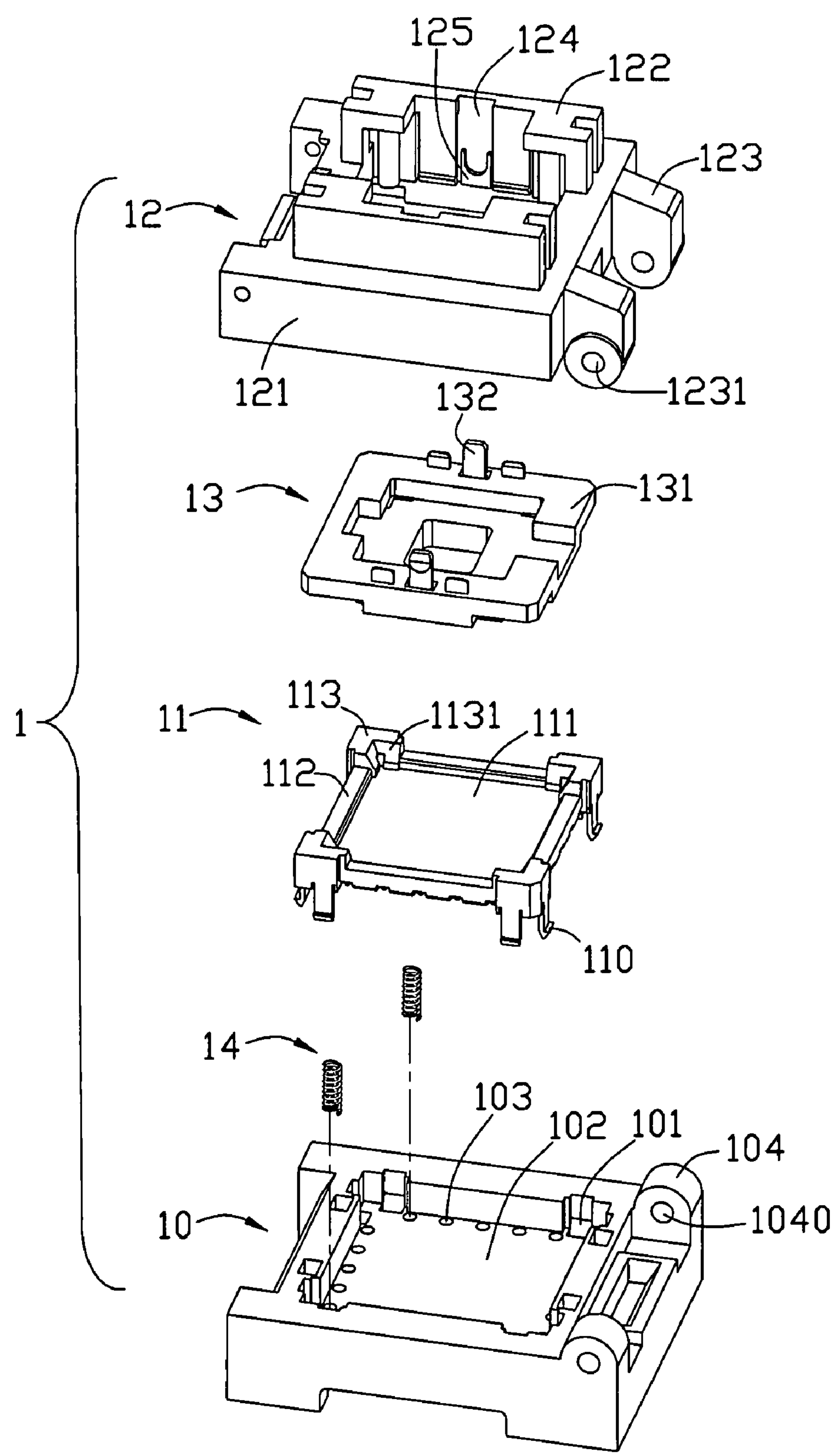
FIG. 2 is an exploded, perspective view of a socket of the present invention.
Figure 3:
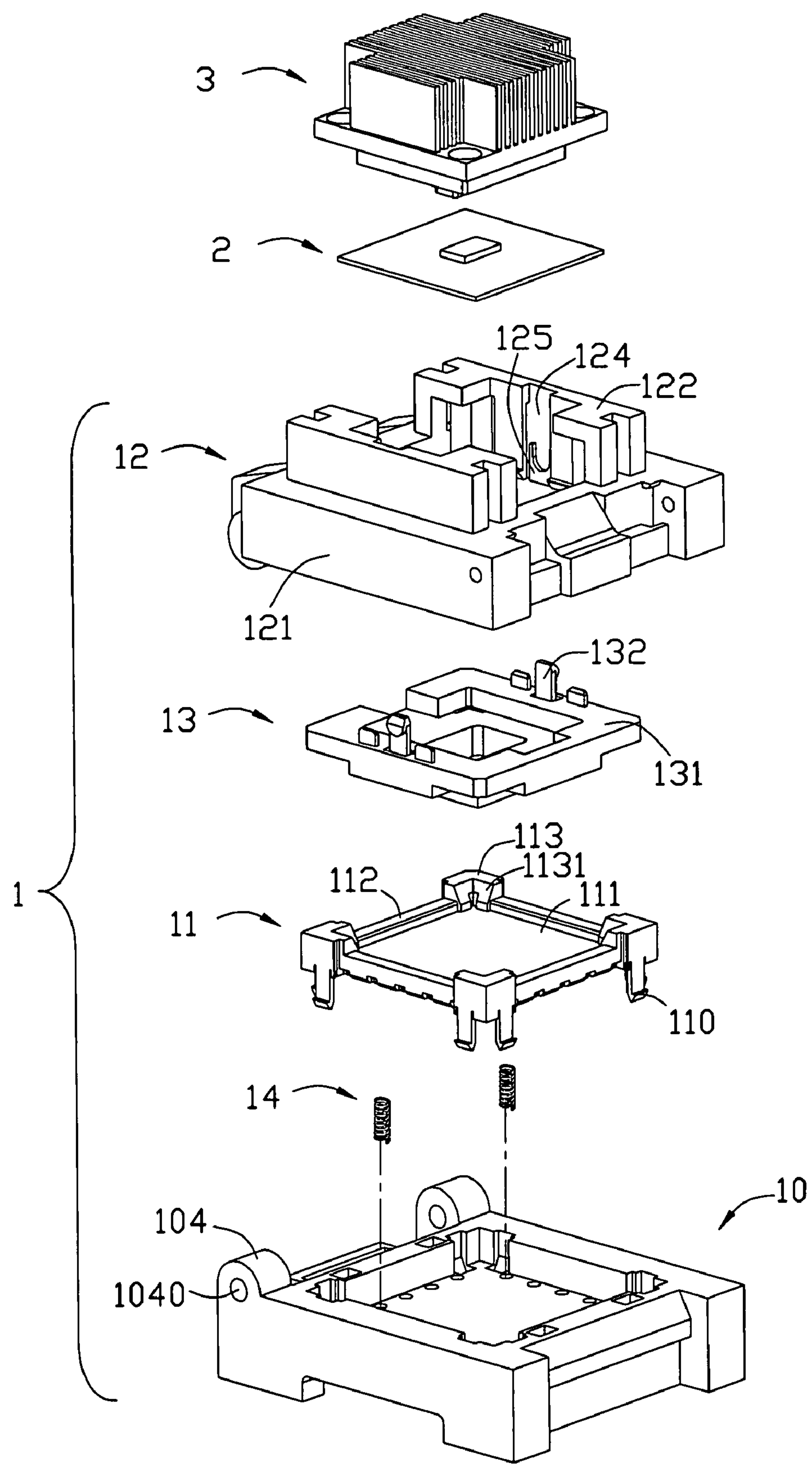
FIG. 3 is another exploded, perspective view of the socket of the present invention, taken from another side, and showing an IC and a radiator.
Figure 4:
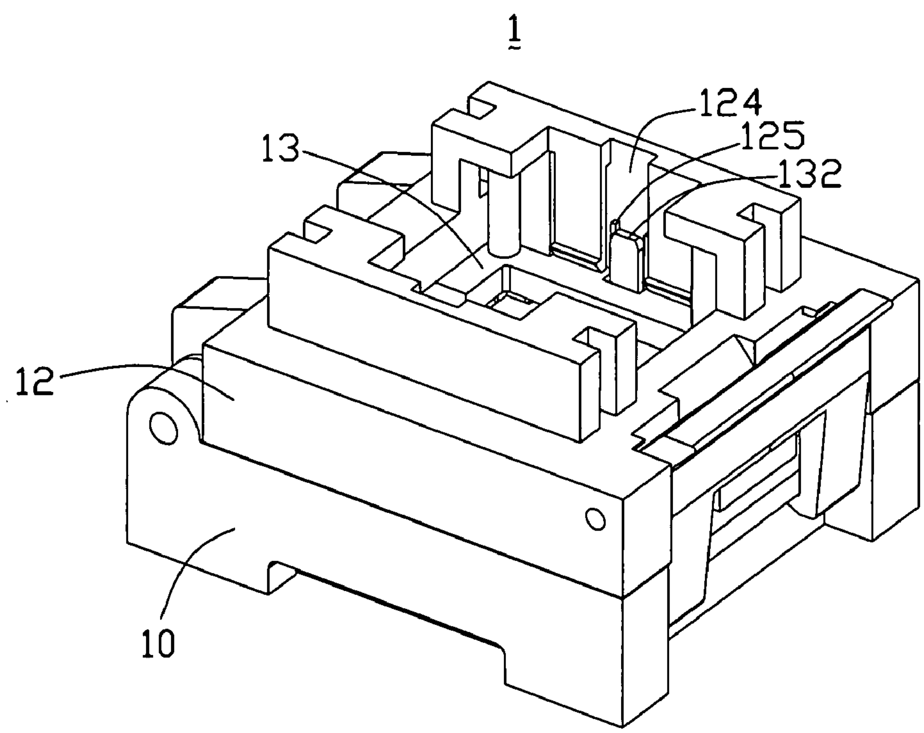
FIG. 4 is an assembled, perspective view of the socket of the present invention.
Figure 5:
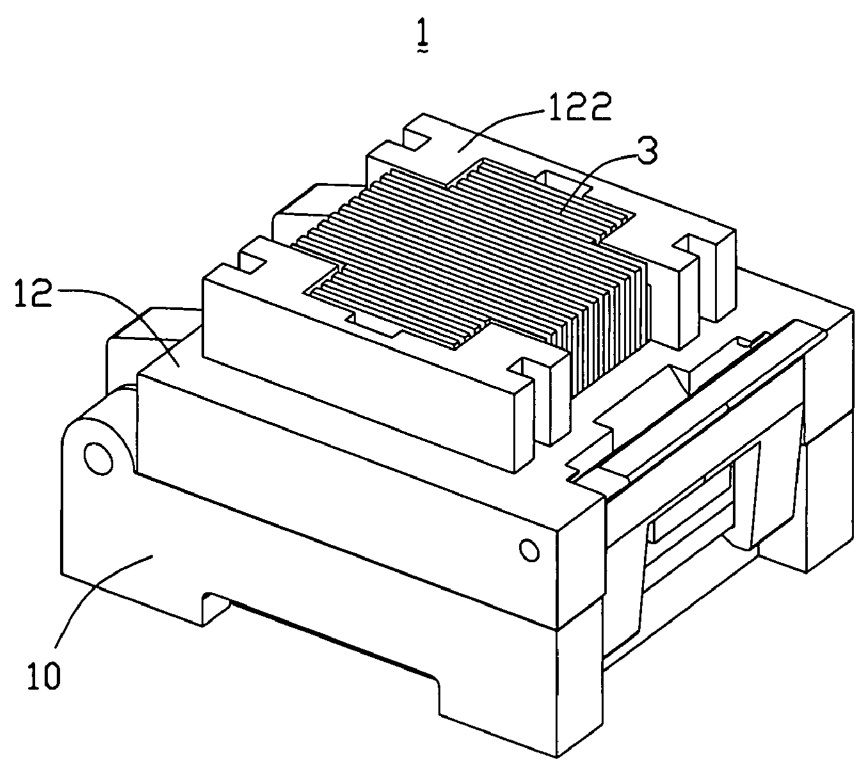
FIG. 5 is a perspective view of the socket in FIG. 4, wherein the radiator is assembled to the socket.

Referring to FIGS. 2 and 3, the cover 12 comprises a base 121 and a mounting portion 122 extending upwardly from the base 121. The base 121 has a pair of engaging portions 123 on an end thereof, each having a through pivot hole 1231, there is a distance between the two engaging portions 123, which is smaller than a distance between the two engaging clumps 104 of the socket body 10. When assembly, the two engaging portion 123 of the cover 12 are located between the two engaging clumps 104 of the socket body 10, by a pivot (not shown) passing through the through holes 1040 and the pivot holes 1231, the cover 12 rotatablely connects with an end of the socket body 10, so that the cover 12 is able to move between a open position and a close position relative to the socket body 10. The cover 12 has an opening (not labeled) which is through the base 121 and the mounting portion 122, a part of the opening defined on the mounting portion 122 is smaller than a part defined on the base 121 in size. A pair of guiding slots 124 are symmetrically formed on opposed inner walls of the opening (not labeled), and each guiding slot 124 has a position portion 125 protruding on a lower portion of the guiding slot 124, which has an arc outline on a top end thereof.

The pressure board 13 has a main body 131, the main body 131 has a receiving cavity (not labeled) and defines a hatch on a bottom wall thereof for receiving a projection portion of the IC 2. The main body 131 has a pair of clasps 132 symmetrically and upwardly extending from two sides of a top surface thereof, the clasp 132 has a certain distance from an edge of the main body 131, the tip of the clasp 132 is an arc figure, which is best to be half-circular or elliptical shape.

The pressure board 13 is received in the opening of the cover 12 by the clasp 132 inserting into the guiding slot 124 and latching with the position portion 125 of the cover 12, which will be described in detail hereinafter. When the pressure board 13 is located in the opening of the cover 12, adjust the position of the pressure board 13 to make the clasps 132 move along the guiding slot 124 and retain to the position portion 125, the tip of the clasp 132 latches with the corresponding position portion 125 and engages with the arc top end of the clasp 132. So that, when the pressure board 13 and the cover 12 are assembled together, the pressure board 13 is able to move upwardly and downwardly relative to the cover 12; and when the pressure board 13 moves to the lowest position, the pressure board 13 can sway right and left within a certain angle.

When the IC 2 is put in the receiving room of the floating board 11, the cover 12 is in the close position, the pressure board 13 actuate the floating board 11 and the IC 2 and make the floating board 11 move downwardly, and then the IC 2 electrically connects with the circuit board. The pressure board 13 is able to sway in a certain angle to adjust a position of a pressing portion thereof to prevent the pressure boar 13 from scraping the IC 2. The opening (not labeled) of the cover 12 further has a radiator 3, the radiator 3 is retained together with pressure board 13, and contact with the projection portion of the IC 2 through the opening of the pressure board 13 to emanate heat of the IC 2 during working.

While the present invention has been described with reference to preferred embodiments, the description of the invention is illustrative and is not to be construed as limiting the invention. Various of modifications to the present invention can be made to preferred embodiments by those skilled in the art without departing from the true spirit and scope of the invention as defined by the appended claims.

What is claimed is:

1. A socket for electrically connecting an electronic package to a circuit board, comprising:

a socket body receiving a plurality of terminals;

a cover rotatablely assembled to the socked body, the cover being formed with at least a position portion;

a pressure board correspondingly formed with at least one clasp for latching with the position portion of the cover to retain the pressure board to the cover;

wherein the clasp upwardly extends from a top surface of the pressure board;

wherein the cover has a guiding slot in an inner sidewall for guiding the clasp, the position portion is protruded on a lower portion of the guiding slot;

wherein the position portion of the cover has an arc outline on a top end thereof, the tip of the clasp of the pressure board is an arc figure to engage with the top end of the position portion to make the pressure board sway right and left within a certain angle.

2. The socket of claim 1, further comprises a floating board, the floating board is disposed between the socket body and the pressure board, and has a supporting board for supporting the IC.

3. The socket of claim 2, wherein the floating board has four upwardly extending L-shaped block on each corner, the block and the supporting board form a guiding inclined face therebetween for guiding IC inserting.

4. A socket for electrically connection an electronic package to a circuit board, comprising:

a socket body receiving a plurality of terminals;

a cover rotatablely assembled to the socked body;

a pressure board assembled to the cover in a manner of the pressure board capable of moving upwardly and downwardly relative to the cover;

a floating board, the floating board is located upon the socket body and is pressed downwardly by the pressure board;

wherein the pressure board has a main body with a receiving cavity and a pair of clasps symmetrically and upwardly extending from two sides of a top surface of the main body;

wherein the cover defines an opening in a center part thereof and a pair of symmetrical guiding slots on opposed inner walls of the opening for the clasps of the pressure board moving along, and each guiding slot defines a position portion protruding from a lower portion thereof to engaging with a tip of the clasp to retain the pressure board to the cover.

5. A socket for electrically connection connecting an electronic package to a circuit board, comprising:

a socket body receiving a plurality of terminals and defining opposite first and second ends thereof in a front-to-back direction;

a cover moveably assembled to the socked socket body wherein said cover has a pivotal end constantly assembled with the first end of the socket body, and a locking end releasably attached to the second end the socket body;

a pressure board, for holding the electronic package, assembled to the cover and having structures capable of moving upwardly and downwardly relative to the cover in a swaying manner about a swinging axis which is located in a middle section of the cover between the pivotal end and the locking end for preventing the electronic package from being scratched during engagement between the pressure board and the electronic package;

wherein arced structures are formed on said pressure board and the cover for implementation of swinging of the pressure board;

wherein the pressure board is moveable between upper and lower positions relative to the cover and is swung at the lower position.

6. The socket as claimed in claim 5, wherein the arced structure formed on the pressure board includes a pair of clasps to latchably engage the arced structure formed on the cover to retain the pressure board to the cover.

* * * * *